United States Patent [19]
Korenaga

[11] Patent Number: 6,002,465
[45] Date of Patent: Dec. 14, 1999

[54] STAGE DEVICE, EXPOSURE APPARATUS USING THE SAME, AND DEVICE PRODUCTION METHOD

[75] Inventor: Nobushige Korenaga, Utsunomiya, Japan

[73] Assignee: Canon Kabushiki Kaisha, Tokyo, Japan

[21] Appl. No.: 08/948,821

[22] Filed: Oct. 10, 1997

[30] Foreign Application Priority Data

Oct. 15, 1996 [JP] Japan ..................................... 8-293234

[51] Int. Cl.⁶ .......................... G03B 27/42; G03B 27/62
[52] U.S. Cl. .............................................. 355/53; 355/75
[58] Field of Search ................................ 355/53, 67, 77, 355/72, 75; 356/399, 400, 401; 250/548; 318/640, 687

[56] References Cited

U.S. PATENT DOCUMENTS

| | | | |
|---|---|---|---|
| 5,022,619 | 6/1991 | Mamada | 248/178 |
| 5,228,358 | 7/1993 | Sakino et al. | 74/479 R |
| 5,446,519 | 8/1995 | Makinouchi | 355/53 |
| 5,467,720 | 11/1995 | Korenaga et al. | 108/20 |
| 5,504,407 | 4/1996 | Wakui et al. | 318/568.17 |
| 5,518,550 | 5/1996 | Korenaga et al. | 118/729 |
| 5,537,186 | 7/1996 | Korenaga et al. | 355/53 |
| 5,608,773 | 3/1997 | Korenaga et al. | 378/34 |
| 5,610,686 | 3/1997 | Osanai | 355/72 |
| 5,681,638 | 10/1997 | Korenaga | 428/119 |
| 5,684,856 | 11/1997 | Ito et al. | 378/34 |
| 5,744,924 | 4/1998 | Lee | 318/568.17 |
| 5,760,564 | 6/1998 | Novak | 318/687 |

*Primary Examiner*—Safet Metjahic
*Assistant Examiner*—Hung Henry Nguyen
*Attorney, Agent, or Firm*—Fitzpatrick, Cella, Harper & Scinto

[57] ABSTRACT

A stage device includes a table, a first stage movable in a first direction on the table, a first linear motor for driving the first stage, the first linear motor including a movable portion and a stationary portion, a second stage movable in a second direction with respect to the first stage, a second linear motor for driving the second stage, the second linear motor including a movable portion and a stationary portion and a third linear motor for driving the first stage, the third linear motor being disposed between the movable portion of the first linear motor and the first stage.

20 Claims, 10 Drawing Sheets

STAGE DEVICE, EXPOSURE APPARATUS USING THE SAME, AND DEVICE PRODUCTION METHOD

BACKGROUND OF THE INVENTION

1. Field of the Invention

The present invention relates to a stage device for positioning a wafer to be processed or the like in, for example, a semiconductor exposure apparatus, and an exposure apparatus using the stage device, and a method for producing a device.

2. Description of the Related Art

In exposure apparatuses used for producing semiconductors, accurate and quick positioning of, for example, a wafer to be exposed is required. Accordingly, progress is being made in the development of an XY stage (stage device) such as a wafer stage in which a linear motor, serving as a driving section, permits accurate positioning of the wafer and has excellent responsivity.

FIG. 10 is a view showing a general reduction projection type exposure apparatus comprising such components as a wafer stage (XY stage) E used for positioning a wafer W, a projection optical system A disposed thereabove, a reticle stage B, and a light source optical system C. Exposure light from the light source optical system C passes through a reticle on the reticle stage B in order to form an image thereof on the wafer W by means of the projection optical system A, whereby the reticle pattern is transferred onto the wafer W.

The wafer stage E is disposed above a table 110 in order to support the projection optical system A and the reticle stage B, with the body frame D being raised from the table 110. Vibration removal devices H are provided between a base G which supports the table 110 and the floor surface F.

The vibration removal devices H, which flexibly support the table 110, serve to prevent transmission of outside vibration to the wafer stage E and the body frame D.

The position of the wafer stage E is measured using a laser interferometer J, and the measured position is fed back to a control system of the wafer stage E. The light source optical system C is supported by a light source support K which rises directly from a floor surface F.

As shown in FIG. 9, the wafer stage E is an XY stage comprising a Y stage 120 capable of freely reciprocating above the table 110 in the Y-axis direction, an X stage 130 capable of freely reciprocating with respect to the Y stage 120 in the X-axis direction, a pair of Y linear motors 140 for moving the Y stage 120 in the Y-axis direction, and an X linear motor 150 for moving the X stage 130 in the X-axis direction.

The table 110 has an XY guide surface 110a which supports the lower surfaces of the Y stage 120 and the X stage 130 without contacting them through an air pad (not shown) or the like. A Y guide 111 rises from one of the ends in the X-axis direction of the table 110 in order to guide the Y stage 120 in the Y-axis direction. A guide surface 111a of the Y guide 111 and the Y stage 120 are kept separated and apart by means of an air pad (not shown) or the like. Driving both of the Y linear motors 140 causes the Y stage 120 to move above the XY guide surface 110a and along the Y guide 111.

The Y stage 120 is a long frame member comprising a pair of Y sliders 121 and a pair of X guides 122 disposed therebetween. The lower surfaces of the Y sliders 121 face the XY guide surface of the table 110, and are supported without contacting it by means of an air pad (not shown) or the like. One of the Y sliders 121 is longer than the other in the Y-axis direction, with a side surface 121a thereof facing the Y guide surface 111a of the Y guide 111 in order for the slider 121 to be guided without contacting the guide surface 111a through an air pad (not shown) or the like. Each Y slider 121 is integrally connected to a movable or moving element 141 of its associated linear motor 140 by means of a corresponding linking plate 123, and a stator 152 of the X linear motor 150 is fixed to the pair of X guides 122 formed integrally with both of the Y sliders 121.

The X stage 130 is a hollow frame member comprising a pair of top and bottom plates 131 and a pair of side plates 132 disposed at both ends thereof, with both of the X guides 122 of the Y stage 120 and the stator 152 of the X linear motor 150 extending through the hollow portion of the X stage 130. The bottom surface of the bottom plate 131 faces the XY guide surface 110a of the table 110, and is supported without contacting it through an air pad (not shown) or the like. The top surface of the top plate 131 is formed as a surface for holding a wafer (not shown) by attraction.

Inner surfaces 132a of the side plates 132 of the X stage 130 face X guide surfaces 122a corresponding to the outer surfaces of each of the X guides 122 of the Y stage 120 in order to be guided along the guide surfaces 122a without contacting them by means of an air pad (not shown) or the like.

The pair of Y linear motors 140 for moving the Y stage 120 in the Y-axis direction each comprises a moving element 141 and a stator 142. Each moving element 141 is integrally connected to an associated Y slider 121 of the Y stage 120 through its associated linking plate 123, while each stator 142 extends through the opening of its associated Y linear motor. Each stator 142 comprises a row of coils 142a arranged in the Y-axis direction and a support 142b supporting the row of coils 142a. On the other hand, each moving element 141 is a hollow frame member comprising a pair of opposing iron plates 141b for holding multi-polar magnets 141a and a pair of aluminum plates 141c affixed at both ends to its associated pair of iron plates 141b.

Successively switching the direction of current supplied to each of the flat coils of each row of coils 142a of each stator 142 of the Y linear motor 140 produces a thrust in the Y-axis direction in each of the movable elements, causing the Y stage 120 as well as the X stage 130 provided therearound to move in the Y-axis direction.

A movable element 151 of the X linear motor 150, which causes the X stage 130 to move along the X guides 122 of the Y stage 120, is a hollow frame member affixed to the bottom surface of the top plate 131 of the X stage 130. Like the moving element 141 of the Y linear motor 140, the movable element 151 comprises a pair of opposing iron plates for holding a multi-polar magnet 151a and a pair of aluminum plates affixed to both ends of each of the iron plates.

On the other hand, the stator 152 of the X linear motor 150 comprises a row of coils 152a arranged in the X-axis direction and a support 152b for supporting the row of coils 152a. When the direction of current supplied to each of the flat coils of the row of coils 152a is successively switched, each moving element 151 produces a thrust in the X-axis direction, causing the X stage 130 to move along the X guides 122 of the Y stage 120 in the X-axis direction.

The stator 142 of each Y linear motor 140 is integrally connected to the table 110 by fixing the supports 142b supporting their corresponding rows of coils 142a to both ends of the table 110.

However, in this conventional device, as mentioned above, the stator of each Y linear motor is integrally connected to the table so that the reaction force produced as a result of driving each Y linear motor is transmitted to the table. Since the table is supported in a flexible manner through the vibration removal device, the table rocks greatly when a reaction force is exerted thereon, thus changing the reference position of, for example, the laser interferometer which is used to measure the position of the XY stage, resulting in errors in measurements. Such a perturbation on the control system is a great obstacle to achieving quick positioning of the exposure apparatus and improving productivity. In addition, when the projection optical system supported by the table rocks, the exposure apparatus does not permit accurate transfer of the reticle pattern.

Since the stator of the X linear motor is integrally connected to the Y stage, the reaction forced produced in the stator due to the driving of the X linear motor is transmitted from a side surface of each Y slider of the Y stage to the Y guide formed integrally with the table, as a result of which the table rocks greatly, which perturbs the control system, as mentioned above.

In addition, when the X stage or the Y stage moves above the table, the position of the center of gravity of the whole XY stage changes, which tilts the table, thus resulting in such problems as changes in the reference position of the laser interferometer or the like, as mentioned above.

SUMMARY OF THE INVENTION

In view of the above-described problems in the conventional art, it is an object of the present invention to provide a stage device, an exposure apparatus using the stage device, and a device production method, in which the transfer accuracy of the exposure apparatus and the productivity thereof are greatly improved by, for example, preventing rocking of the table that is caused by the production of a reaction force or a change in the position of the center of gravity during movement of the stage.

To this end, according to one aspect, the present invention which achieves these objectives relates to a stage device comprising a table, a first stage movable in a first direction on the table, a first linear motor for driving the first stage, the first linear motor including a movable portion and a stationary portion, a second stage movable in a second direction with respect to the first stage, a second linear motor for driving the second stage, the second linear motor including a movable portion and a stationary portion, and a transmission mechanism. The transmission mechanism transmits a force substantially in the first direction and does not transmit a force in the second direction between the movable portion of the first linear motor and the first stage.

According to another aspect, the present invention which achieves these objectives relates to a stage device comprising a table, a first stage movable in a first direction on the table, a first linear motor for driving the first stage, the first linear motor including a stationary portion and a movable portion, a second stage movable in a second direction with respect to the first stage, a second linear motor for driving the second stage, and means for compensating for shifting of the center of gravity of the first stage or the center of gravity of the second stage caused by movement of the first stage or second stage.

According to still another aspect, the present invention which achieves these objectives relates to an exposure apparatus comprising means for exposing the substrate to exposure light, and a stage for positioning the substrate before exposure. The stage comprises a table, a first stage movable in a first direction on the table, a first linear motor for driving the first stage, the first linear motor including a movable portion and a stationary portion, a second stage movable in a second direction with respect to the first stage, a second linear motor for driving the second stage, the second linear motor including a movable portion and a stationary portion, and a transmission mechanism. The transmission mechanism transmits a force substantially in the first direction and does not transmit a force in the second direction between the movable portion of the first linear motor and the first stage.

According to still another aspect, the present invention which achieves these objectives relates to an exposure apparatus comprising means for exposing a substrate to exposure light, and a stage for positioning the substrate for exposure. The stage comprises a table, a first stage movable in a first direction on the table, a first linear motor for driving the first stage, the first linear motor including a stationary portion and a movable portion, a second stage movable in a second direction with respect to the first stage, a second linear motor for driving the second stage, and means for compensating for shifting of the center of gravity of the first stage or the center of gravity of the second stage caused by movement of the first stage or the second stage.

According to another aspect, the present invention which achieves these objectives relates to a method of producing a device using an exposure apparatus in which a substrate is positioned by means of a stage for exposure of the substrate. The exposure apparatus comprises means for exposing the substrate to exposure light and a stage device for positioning the substrate for exposure. The stage device comprises a table, a first stage movable in a first direction on the table, a first linear motor, for driving the first stage, including a movable portion and a stationary portion, a second stage movable in a second direction with respect to the first stage, a second linear motor, for driving the second stage, including a movable portion and a stationary portion, and a transmission mechanism which transmits a force substantially in a first direction and does not transmit a force in a second direction between the movable portion of the first linear motor and the first stage. The method comprises the steps of positioning the substrate prior to exposure with exposure light and exposing the substrate to the exposure light. The positioning step comprises the steps of placing the substrate on the stage device, activating the first linear motor to drive the first stage in the first direction by movement of the movable portion thereof, activating the second linear motor to drive the second stage in the second direction by movement of the movable portion of the second linear motor, and transmitting a force substantially in the first direction and not transmitting a force in the second direction between the movable portion of the first linear motor and the first stage when the first linear motor is activated.

According to still another aspect, the present invention which achieves these objectives relates to a method for producing a device in which a substrate is positioned by means of a stage for exposure of the substrate. The stage comprises a table, a first stage movable in the first direction above the table, a first linear motor, for driving the first stage, including a stationary portion and a movable portion, a second stage movable in a second direction with respect to the first stage, a second linear motor for driving the second stage, and means for compensating for shifting of the center of gravity of the first stage or the center of gravity of the second stage caused by movement of the first stage or the second stage. The method comprises the steps of positioning the substrate prior to exposure with the exposure light and exposing the substrate to the exposure light. The positioning step comprises the steps of placing the substrate on the stage, activating the first linear motor to drive the first stage in the first direction by movement of the movable portion, activating the second linear motor to drive the second stage in the second direction, and compensating for any shifting that occurs in the position of the center of gravity of the first stage or the position of the center of gravity of the second stage caused by movement of the first stage or the second stage.

Other objects and preferred forms of the present invention will become apparent from the following description of the preferred embodiments.

DESCRIPTION OF THE PREFERRED EMBODIMENTS

A description will now be given of the preferred embodiments of the present invention with reference to the drawings.

<Embodiment 1>

Figure 1:
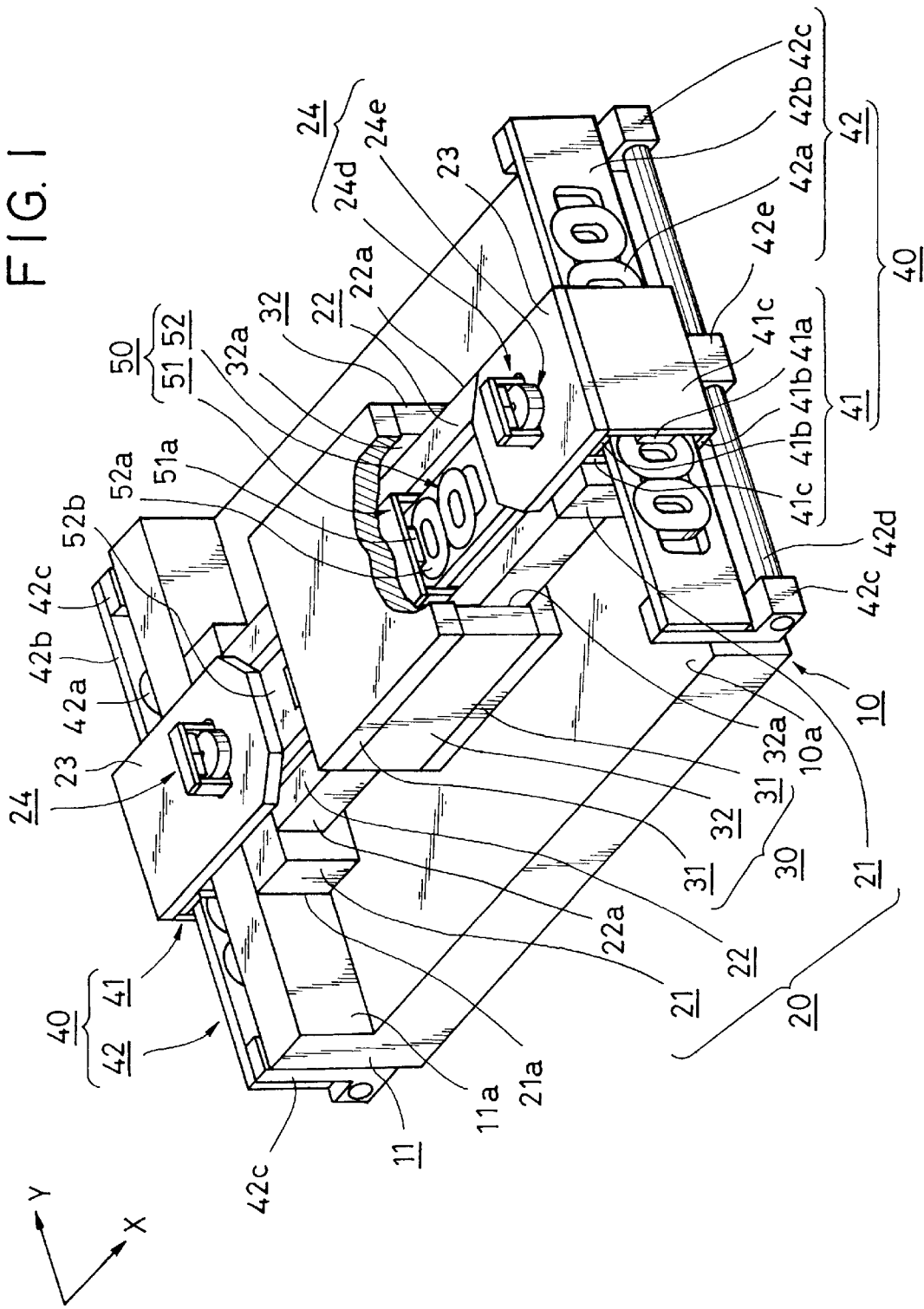
FIG. 1 is a perspective view of a wafer stage of Embodiment 1 in accordance with the present invention.
Figure 10:
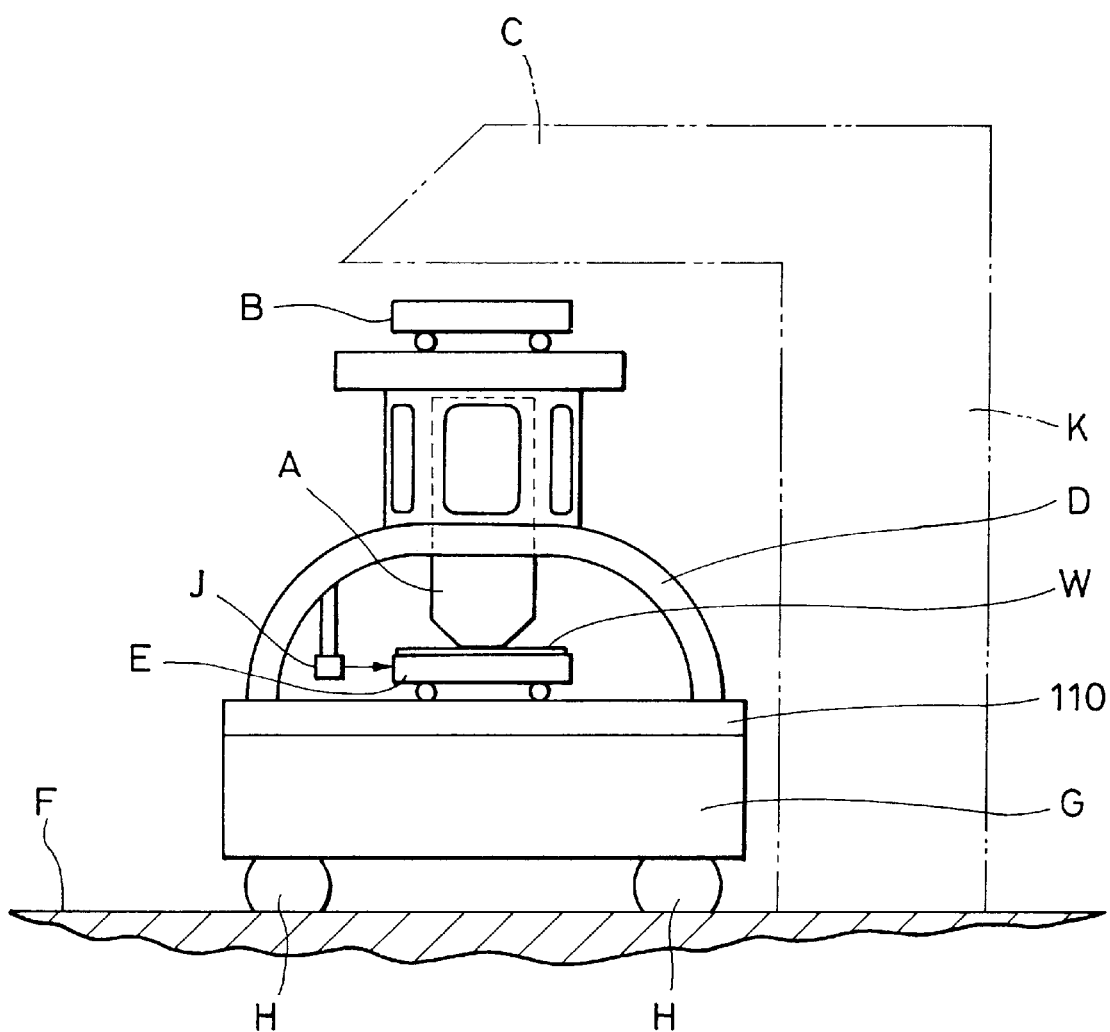
FIG. 10 is a view illustrating the entire exposure apparatus.

FIG. 1 is a view of a wafer stage of Embodiment 1 in accordance with the present invention. As shown in FIG. 1, the wafer stage device comprises a Y stage 20, an X stage 30, a pair of Y linear motors 40, and an X linear motor 50. The Y stage 20 is a first stage which can freely reciprocate in a Y-axis direction above a table 10. The X stage 30 is a second stage which can freely reciprocate in an X-direction above the Y stage 20. The pair of Y linear motors 40 are first linear motors for moving the Y stage 20 in the Y-axis direction. The X linear motor 50 is a second driving means for moving the X stage 30 in the X-axis direction. The stage device is incorporated in the exposure apparatus of FIG. 10.

The table 10 has an XY guide surface 10a which supports the bottom surfaces of the Y stage 20 and the X stage 30, without contacting them, through, for example, an air pad (not shown) which is a static pressure bearing means. A Y guide 11 rises from one of the ends in the X-axis direction of the table 10 in order to guide the Y stage in the Y-axis direction. A guide surface 11a of the Y guide 11 and the Y stage 20 are kept apart from each other by means of, for example, an air pad (not shown) which is a static pressure bearing means. Driving the Y linear motor 40 causes the Y stage 20 to move above the XY guide surface 10a of the table 10 and along the Y guide 11.

Figure 2:
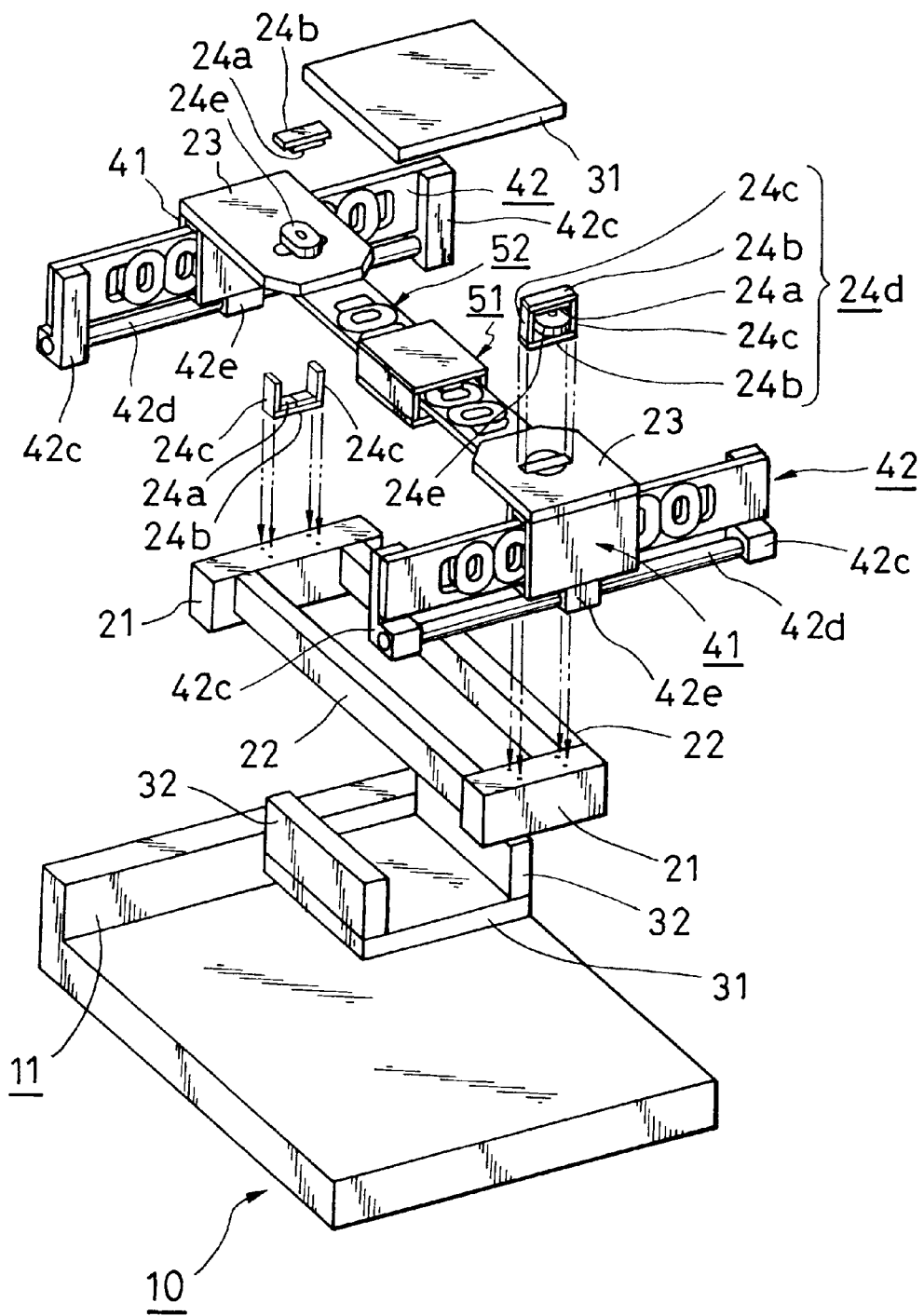
FIG. 2 is an exploded perspective view of the wafer stage of FIG. 1.

As shown in FIG. 2, the Y stage 20 is a long frame member comprising a pair of Y sliders 21 and a pair of X guides 22 disposed between the Y sliders 21. The lower surfaces of the Y sliders 21 face the XY guide surface 10a of the table 10 and are supported by the XY guide surface 10 without contacting it through an air pad (not shown) or the like. One of the Y sliders 21 is longer in the Y-axis direction than the other. Its side surface, designated 21a, faces a guide surface 11a of the Y guide 11 and is guided without contacting the Y guide surface 11a through an air pad (not shown) or the like. Each of the Y sliders 21 is linked to their respective movable elements 41 of the Y linear motors 40 through their respective linking plates 23 and their respective driving power transmitting linear motors 24, serving as second linear motors. Each of the linking plates 23 are integrally connected to their respective movable elements 41 of the Y linear motors 40 and the stator 52 of the X linear motor 50.

The X stage 30 is a hollow frame member formed by a pair of top and bottom plates 31 and a pair of side plates 32 disposed between the plates 31, with both of the X guides 22 of the Y stage 20 and the stator 52 being a stationary portion of the X linear motor 50 extending through the hollow frame member. The bottom surface of the bottom plate 31 faces the XY guide surface 10a of the table 10 and is supported by the surface 10a without contacting it through an air pad (not shown) or the like, while the top surface of the top plate 31 is formed as a surface for holding a wafer or substrate (not shown) by attraction.

Inside surfaces 32a of each of the side plates 32 of the X stage 30 face the X guide surfaces 22a corresponding to the outer surfaces of the X guides 22 of the Y stage 20. The surfaces 32a are guided along the X guide surfaces 22a without contacting them through an air pad (not shown) or the like.

Each Y linear motor 40 comprises a movable element 41 and a stator 42. Each movable element 41 is a movable portion integrally connected with its associated linking plate 23, as mentioned above, while each stator 42 is a fixed portion extending through the opening of its associated movable element. Each stator 42 comprises a row of coils 42a arranged in the Y-axis direction, a support 42b supporting the row of coils 42a, and stationary members 42c supporting both ends of the support 42b. On the other hand, each movable element 41 is a hollow frame member which comprises a pair of opposing iron plates 41b for holding a multi-polar magnet 41a, and a pair of aluminum plates 41c affixed to both ends of the pair of iron plates 41b.

When the direction of current supplied to each of the flat coils in each row of coils 42a of the stators 42 of each Y linear motor is switched successively, each movable element 41 produces a thrust in the Y-axis direction. The thrust causes the stator 52 of the X linear motor 50 to move in the Y-axis direction. The thrust is also transmitted to the Y stage 20 through each driving power transmitting linear motor 24 to cause the X stage 30 to move in the Y-axis direction.

The movable element 51 of the X linear motor 50 which moves the X stage 30 along the X guides 22 of the Y stage 20 is a hollow frame member which is affixed to the lower surface of the top plate 31 of the X stage 30. Like each of the movable elements 41 of the Y linear motors 40, the movable element 51 comprises a pair of opposing iron plates for holding a multi-polar magnet 51a and a pair of aluminum plates affixed to both ends of the pair of iron plates.

The stator 52 of the X linear motor 50 comprises a row of coils 52a arranged in the X-axis direction and a support 52b for supporting the row of coils 52a. Successively switching the direction of current supplied to each of the flat coils of the row of coils 52a produces a thrust in the movable element 51 in the X-axis direction, causing the X stage 30 to move in the X-axis direction along the X guides 22 of the Y stage 20.

The wafer on the X stage 30 is positioned in the XY directions by driving the Y linear motor 40, the X linear motor 50, and the like, as mentioned above. After positioning in such a manner, exposure light from a light source optical system being an exposure means (not shown) passes through a reticle (not shown) disposed in the optical path thereof to expose the wafer.

The stationary members 42c of the stators 42 of each of the Y linear motors 40 are affixed to reaction force receiving frames serving as supporting means. This frame, which is formed independently of the body frame of the exposure apparatus which supports the table 10, rises from the floor surface. Both of the stationary members 42c hold both ends of a guide bar 42d disposed along the stator 42 of its associated Y linear motor 40. Each of the movable elements 41 of the Y linear motors 40 is formed integrally with slide members 42e which can freely slide on their corresponding guide bars 42d to allow them to be guided in the Y-axis direction.

Accordingly, since the stators 42 of each of the Y linear motors 40 and the guide bars 42d for guiding their corresponding movable member 41 are supported by their corresponding reaction force receiving frames formed independently of the body frame of the exposure apparatus, driving each of the Y linear motors 40, as mentioned above, produces a reaction force produced as a result of driving in the Y-axis direction, which is directly transmitted to the floor through each reaction force receiving frame. Thus, the table 10 will not rock, since the reaction force of the driving force of each linear motor 40 is prevented from being transmitted to the table 10.

When the stator 52 of the X linear motor 50 is fixed on the Y stage 20, the reaction force produced by driving the X linear motor 50 in the X-axis direction is transmitted to the Y stage 20 and thus to the table 10 through the Y slider 21 opposing the Y guide 11 rising from the table 10, causing the table 10 to rock. Such a problem is overcome as follows. Namely, as mentioned above, only the stator 52 of the X linear motor 50 is fixed to the linking plates 23 in order to form the stator 52 integrally with the movable elements 41 of the Y linear motors 40. At the Y stage 20 are provided driving power transmitting linear motors 24 disposed between the frame members (formed by their respective Y sliders 21 and their respective X guides 22) and their respective linking plates 23 in order to prevent transmission of the reaction force, produced as a result of driving the X linear motor 50, to the Y stage 20.

Like the stators 42 and 52 of the Y linear motor 40 and the X linear motor 50, respectively, each driving power transmitting linear motor 24 comprises a moving element 24d, being a hollow frame member, and a stator 24e. Each moving element 24d comprises a pair of opposing iron plates 24b for holding a bipolar magnet 24a, and a pair of aluminum plates 24c affixed to both ends of the iron plates 24b. On the other hand, each stator 24e, composed of flat coils, is arranged through the hollow portion of its corresponding linear motor 24. Each movable element 24d is affixed to its corresponding slide 21 of the Y stage 20, while each stator 24e is affixed to its corresponding linking plate 23.

The moving element 24d and the stator 24e of each driving power transmitting linear motor 24 are kept separated and apart by a magnetic circuit produced by the bipolar magnets 24a of the movable elements 24d. In accordance with the amount of current supplied to each stator 24e, a thrust is produced between the stators and their corresponding moving elements 24d in the Y-axis direction. Since a thrust is not produced in the X direction, motor 24 is not constrained in the X direction when the motor 24 is driven in the Y-axis direction. This causes the Y stage 20, the X stage 30, and the moving element 51 of the X linear motor 50 to be driven integrally in the Y-axis direction. The moving elements 41 of each of the Y linear motors move in accordance therewith. Here, when ratio F of the driving power of each driving power transmitting linear motor 24 in the Y-axis direction to the driving power of its corresponding Y linear motor 40 is controlled in accordance with Formula (1) below, the Y stage 20 and the movable elements 41 of the Y linear motors 40 can be integrally driven in the Y-axis direction, without changing their relative positions, while each linking plate 23 and its corresponding Y stage 20 are kept apart from each other.

$$F=A/(A+B) \tag{1}$$

where A equals the sum of the masses of the X stage 30, the movable element 51 of the X linear motor 50, the Y stage 20, and the movable element 24d of the driving power transmitting linear motor 24; and B is equal to the sum of the masses of the stator 24e of the driving power transmitting linear motor 24, the linking plate 23, the stator 52 of the X linear motor 50, the movable element 41 of the Y linear motor 40, and the slider member 42e.

In other words, when the current through the driving power transmitting linear motor 24 and the Y linear motor 40 is controlled such that the ratio of the driving force of the motor 24 to the driving force of the motor 40 satisfy Formula (1), it is possible to integrally move these motors, while keeping the linking plate 23, formed integrally with the stator 52 of the X linear motor 50, and the Y stage 20 apart from each other. Since the linking plate 23 and the Y stage 20 do not contact each other, even when the X linear motor 50 is driven along the outer surfaces of the Y stage, the linear motor 24 does not transmit driving power in the X-axis direction. Therefore, the reaction force produced by driving the X linear motor 50 in the X-axis direction is transmitted to the movable elements 41 of each of the Y linear motors 40 through their corresponding linking plate 23, so that it is not transmitted to the Y stage 20. Thus, such problems as the rocking of the table due to the transmission of a reaction force produced by driving the X linear motor 50 through the Y stage 20 do not occur.

In the present embodiment, rocking of the table caused by the reaction force produced by driving the Y linear motors 40 in the Y-axis direction is prevented by supporting the stators 42 of each of the Y linear motors 40 on pressure-receiving frames provided independently of the body frame of the exposure apparatus. Transmission of the reaction force, produced by driving the X linear motor 50 in the X-axis direction, to the table is prevented by affixing the stator 52 of the X linear motor 50 to the moving elements 41 of the Y linear motors 40 on the one hand, and providing driving power transmitting linear motors 24, which transmit driving power only in the Y-axis direction between it and the Y stage 20 on the other. In the step of positioning a wafer or the like, the table will not rock due to the reaction force produced by driving each linear motor, thus making it possible to greatly increase the positioning speed and accuracy. This greatly increases the productivity of the exposure apparatus, which increases transfer accuracy.

Figure 3:
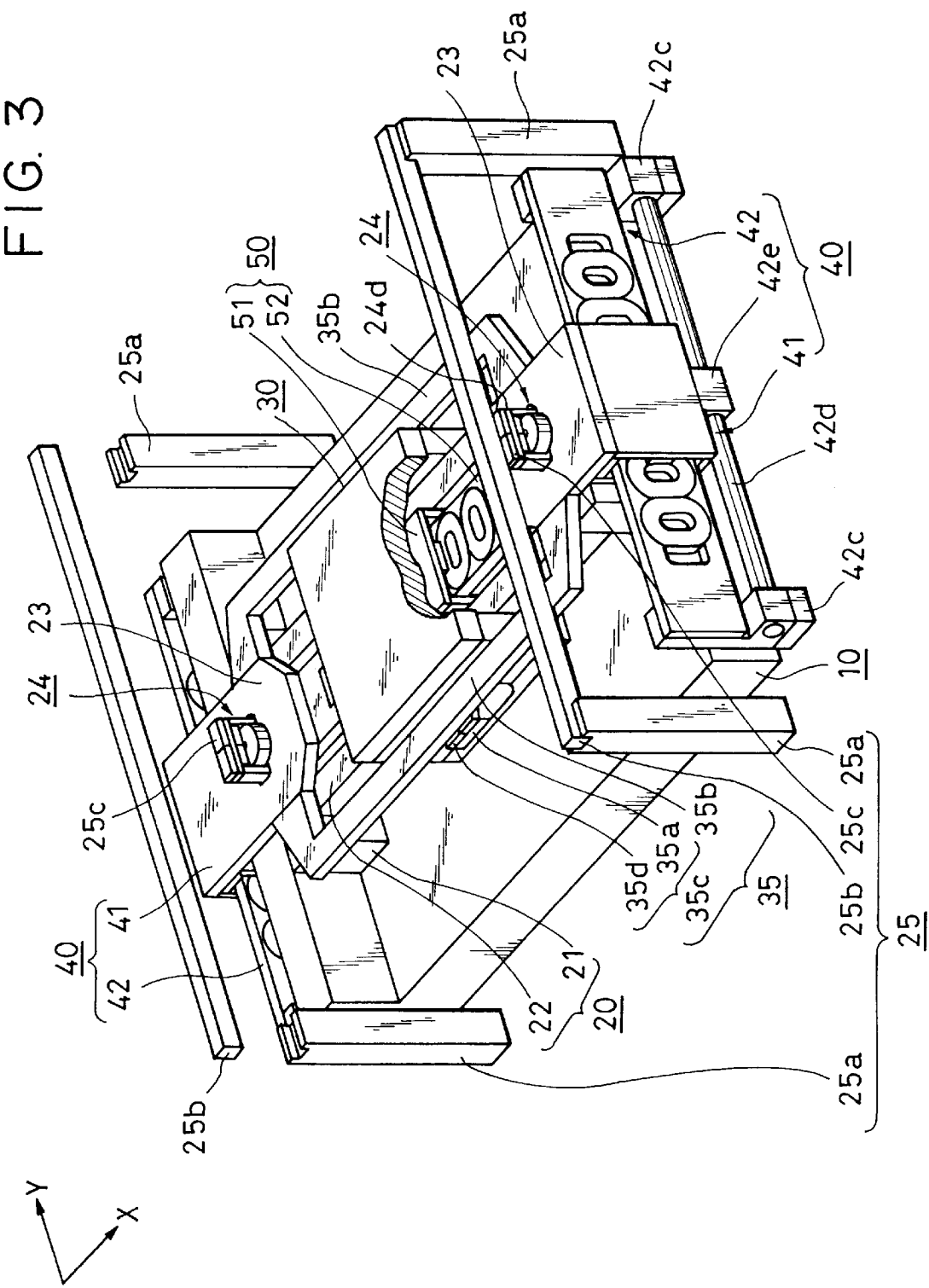
FIG. 3 is a perspective view of a modification of the wafer stage of Embodiment 1.
Figure 4:
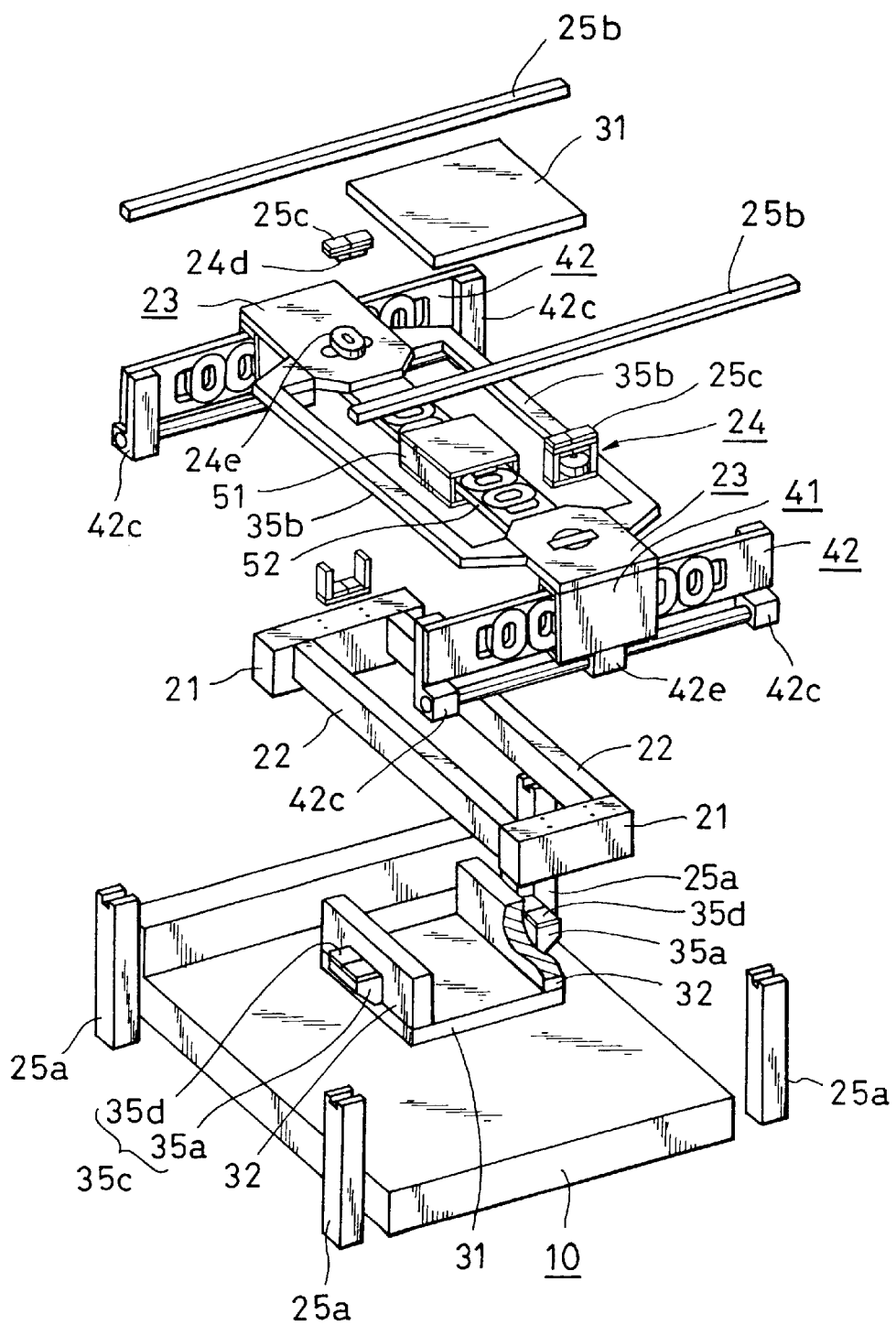
FIG. 4 is an exploded perspective of the wafer stage of FIG. 3.

FIGS. 3 and 4 show a modification of the stage device. Reference numerals in FIG. 3 and FIG. 4 which are the same as those in FIGS. 1 and 2 denote the same elements. The modification differs from the wafer stage of Embodiment 1 in that it is provided with a Y stage weight compensating structure 25 and an X stage weight compensating structure 35 for canceling the weight of the Y stage 20 and the weight of the X stage 30, respectively.

When the Y stage 20 or the X stage 30 moves above the table 10, the center of gravity of the entire wafer stage shifts, causing the table 10 to tilt and thus changing the reference positions of measuring systems, such as laser interferometers, projection optical systems, or other systems supported by the body frame of an exposure apparatus, which is formed integrally with the table 10. Therefore, a transfer pattern is less accurately superimposed on, for example, a wafer, and the control system of the XY stage is perturbed. Accordingly, the compensating structure 25 and the compensating structure 35 are provided to cancel the weight of the Y stage 20 and the weight of the X stage 30, respectively, by magnetic attraction. They are constructed so that the position of the center of gravity of the wafer stage is not considerably or substantially changed, even when the Y stage 20 and the X stage 30 move above the table 10.

The Y stage weight compensating structure 25 comprises a pair of Y stationary beams 25b and Y magnet units 25c. The pair of Y stationary beams 25b, being first magnetic members, are supported from the floor surface by Y stage weight compensating device supports 25a provided independently of the body frame supporting the table 10. The Y magnet units 25c, being first magnet means, are composed of upwardly facing bipolar magnets that are fixed to the top portions of the movable elements 24d of their corresponding driving power transmitting linear motors 24. Each Y stationary beam 25b, made of magnetic material, is disposed so as to oppose the upwardly facing bipolar magnet of its corresponding Y magnet unit 25c.

A magnetic attraction force which attracts the Y stage 20 upwards is generated by a magnetic circuit formed by the Y stationary beam 25b, a back yoke formed by the top portion of the movable element 24d of the driving power transmitting linear motor 24, and the upwardly facing bipolar magnet of the Y magnet unit 25c.

Accordingly, proper selections are made of the dimensions of the upwardly facing bipolar magnets of each of the Y magnet units 25c and of the dimensions of the gaps between the bipolar magnets and their corresponding opposing Y stationary beams 25b such that the aforementioned magnetic attraction force cancels the weight of each Y stage 20 so that the position of the center of gravity of the wafer stage is not substantially changed when each Y stage 20 moves above the table 10.

The X stage weight compensating structure 35 comprises a magnet unit 35c being a second magnetic means. The unit 35c comprises back yokes 35a and upwardly facing bipolar magnets 35d supported by their corresponding back yokes 35a. The back yokes 35a are fixed to both sides of the X stage 30. The upwardly facing bipolar magnets 35d of the X magnet units 35c oppose a pair of X stationary beams 35b or second magnetic members made of magnetic materials. Both ends of each X stationary beam 35b are fixed to its associated linking plate 23.

As with the Y stage 20, the X stage 30 is attracted upwardly by the magnetic attraction force generated by the magnetic circuit formed by the X stationary beams 35b and the upward facing bipolar magnets 35d. The upward attraction cancels the weight of the X stage 30 so that the position of the center of gravity of the wafer stage is not substantially changed when each X stage 30 moves above the table 10.

In this way, canceling the weights of the X stage 30 and Y stage 20 which move above the table 10 supporting the wafer stage greatly reduces the overall weight of the wafer stage on the table. This reduces the amount of energy consumption as a result of a reduction in the amount of driving force which the X linear motor 50 and the Y linear motor 40 are required to generate to position the wafer. In addition, problems caused by driving the wafer stage such as tilting of the body frame of the exposure apparatus are prevented from occurring, thus making it possible to realize an exposure apparatus with a low running cost and a high productivity.

<Embodiment 2>

Figure 5:
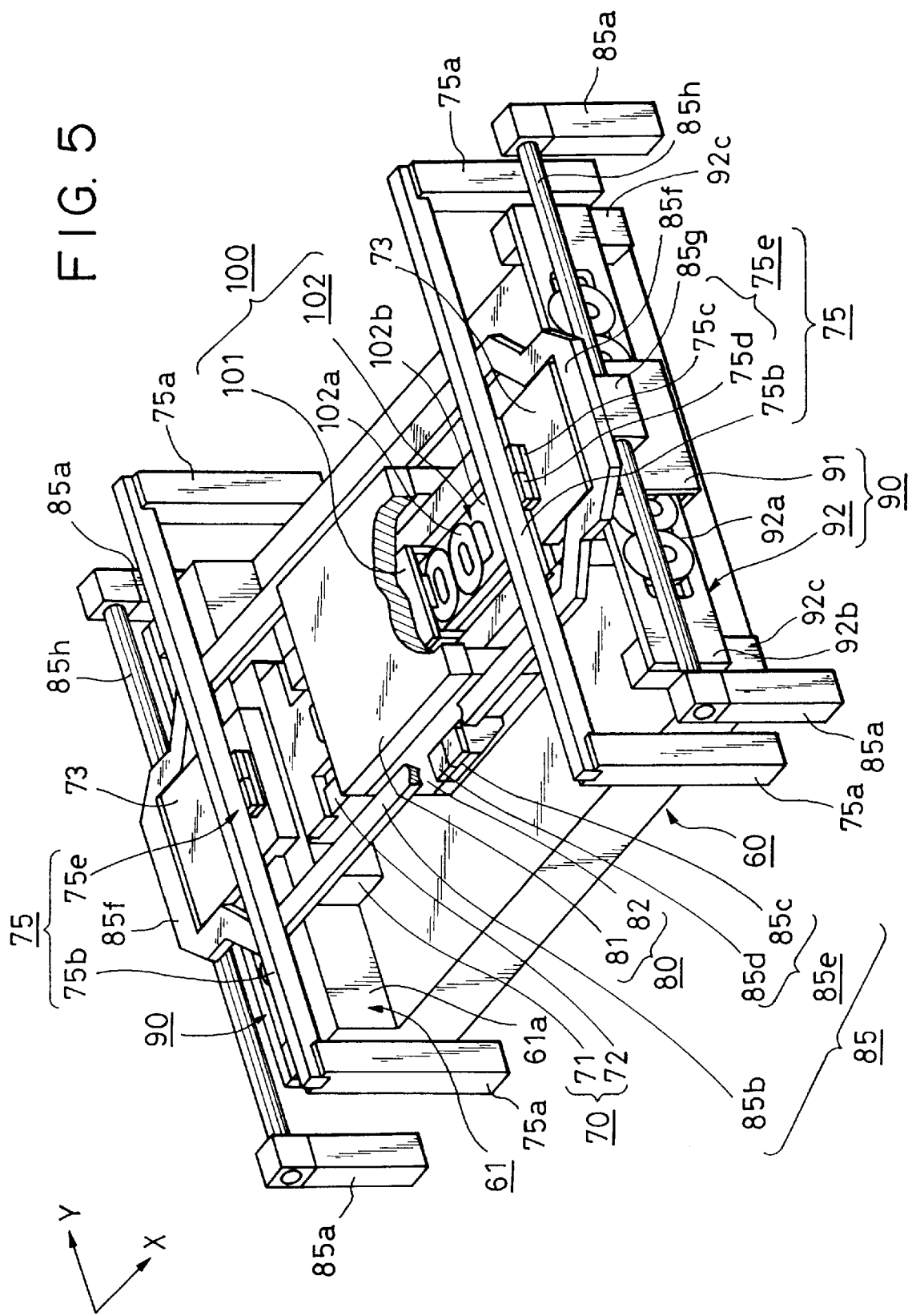
FIG. 5 is a perspective view of a wafer stage of Embodiment 2 in accordance with the present invention.
Figure 6:
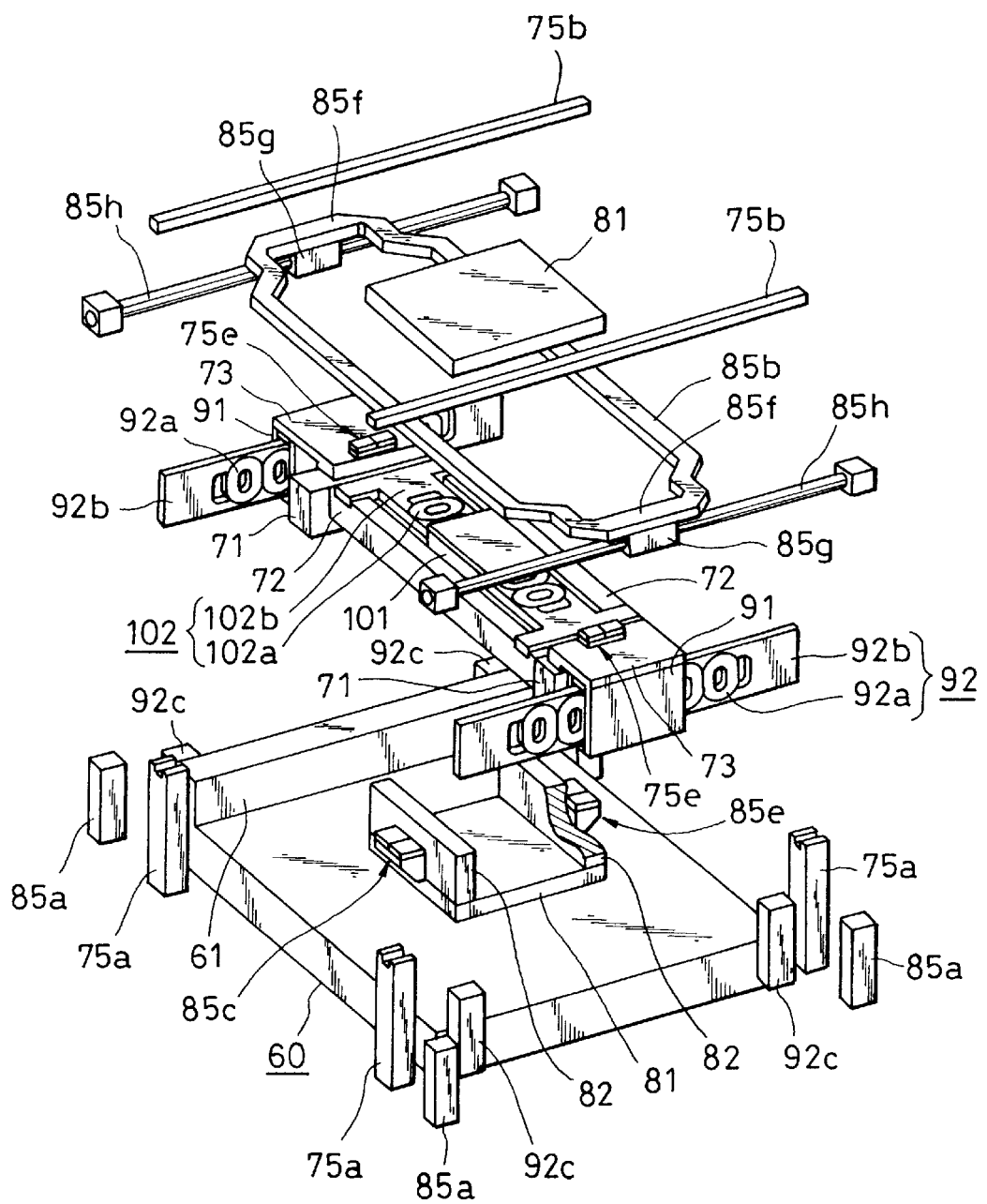
FIG. 6 is an exploded perspective view of the wafer stage of FIG. 5.

FIGS. 5 and 6 show a wafer stage of Embodiment 2 in accordance with the present invention. The wafer stage is a stage device comprising a Y stage 70 being a first stage, an X stage 80 being a second stage, a pair of Y linear motors 90 being first driving means, and an X linear motor 100 being a second driving means. The Y stage 70 can reciprocate freely in the Y-axis direction above the table 60. The X stage 80 can reciprocate freely in the X-axis direction above the Y stage 70. The Y linear motors 90 move the Y stage 70 in the Y-axis direction. The X linear motor 100 moves the X stage 80 in the X-axis direction. The stage device is incorporated in the exposure apparatus of FIG. 10.

The table 60 has an XY guide surface which supports the lower surfaces of the Y stage 70 and the X stage 80 without contacting them by means of an air pad (not shown) or the like. A Y guide 61 rises from one of the ends in the X-axis direction of the table 60 in order to guide the Y stage 70 in the Y-axis direction. A Y guide surface of the Y guide 61 and the Y stage 70 are kept apart by an air pad (not shown) or the like, so that when both of the Y linear motors 90 are driven, the Y stage 70 moves above the XY guide surface of the table 60 and along the Y guide 61.

The Y stage 70 is a long frame member in the X-axis direction comprising a pair of Y sliders 71 and a pair of X guides 72 disposed therebetween. The lower surfaces of each of the Y slides 71 face the XY guide surface of the table 60 and are supported by the XY guide surface without contacting it through an air pad (not shown) or the like. One of the Y sliders 71 is longer in the Y-axis direction than the other slider. A side surface of this Y slider 71 faces the Y guide surface of the Y guide 61 and is guided without contacting the Y guide surface through an air pad (not shown) or the like. The Y sliders 71 are integrally connected to movable elements 91 of their corresponding linear motors through their corresponding linking plates 73. A stator 102 of the X linear motor 100 is affixed to the X guides 72 formed integrally with their corresponding Y sliders 71.

The X stage 80 is a hollow frame member comprising a pair of top and bottom plates and a pair of side plates 82 disposed therebetween, with the X guides 72 of the Y stage 70 extending through the hollow portion of the X stage 80. The bottom surface of the bottom plate 81 faces the XY guide surface of the table 60, and is supported by the XY guide surface without contacting it through an air pad (not shown) or the like. On the other hand, the top surface of the top plate 81 is formed into a surface for holding a wafer (not shown) by attraction.

The inside surfaces of the side plates 82 of the X stage 80 face the X guide surfaces of the X guides 72 of the Y stage 70 and are guided without contacting the X guide surfaces through an air pad (not shown) or the like.

Each Y linear motor 90 which moves the Y stage 70 in the Y-axis direction comprises a movable element 91 and a stator 92. Each movable element 91 is integrally connected to its corresponding Y slider 61 of the Y stage 60 through its corresponding linking plate 73, as mentioned above. In addition, each movable element 91 is a hollow frame member formed by a pair of opposing iron plates for holding multipolar magnets and a pair of aluminum plates affixed to both ends of the pair of iron plates. Each stator 92 extends through an opening of the Y linear motor 90 and comprises a row of coils 92a arranged in the Y-axis direction and a support 92b supporting the row of coils 92a.

Successively switching the direction of current supplied to each of the flat coils of each of the rows of coils 92a of the stators 92 of the Y linear motor 90 produces a thrust in the Y-axis direction in each of the Y linear motors 90, causing the Y stage 70, as well as the X stage 80 surrounding the Y stage 70, to move in the Y-axis direction.

The moving element 101 of the X linear motor 100 which moves the X stage 80 along the X guides 72 of the Y stage 70 is a hollow frame member affixed to the lower surface of the top plate 81 of the X stage 80. Like the movable elements 91 of the Y linear motors 90, the movable element 101 comprises a pair of opposing iron plates for holding a multipolar magnet and a pair of aluminum plates affixed to both ends of the pair of iron plates.

The stator 102 of the X linear motor 100 comprises a row of coils 102a arranged in the X-axis direction and a support 102b which supports the row of coils 102a. Successively switching the direction of current supplied to each of the flat coils of the row of coils 102a produces a thrust in the movable element 101 in the X-axis direction, causing the X stage 80 to move in the X-axis direction and along the X guides 72 of the Y stage 70.

Each stator 92 of each Y linear motor 90 is fixed to a side surface of the table 60 by means of a pair of supports 92c.

In the present embodiment, the stators 92 of each of the linear motors 90 are fixed to the table 60, and the movable elements 91 of each of the Y linear motors 90 are also integrally connected to the movable element 101 of the X linear motor 100 through their corresponding linking plates 73, so that the reaction force produced by driving the Y linear motors 90 and the X linear motor 100 is directly transmitted to the table 60. Thus, this structure does not directly prevent vibration of the table or the like. However, for example, the tilting of the table 60 caused by the generation of a reaction force can be reduced by providing a Y stage weight compensating structure 75 and an X stage weight compensating structure 85 for canceling the weight of the Y stage and the weight of the X stage, respectively. These structures prevent shifting of the position of the center of gravity of the wafer stage and greatly reduce the amount of driving force which the Y linear motors 80 and the X linear motor 100 are required to produce.

The Y stage weight compensating structure 75 comprises a pair of Y stationary beams 75b being first magnetic members and Y magnet units 75e being first magnetic means. The beams 75b are supported from the floor surface by means of Y stage weight compensating structure supports 75a provided independently of the body frame supporting the table 60. Each Y magnet unit 75e is composed of a back yoke 75c fixed to its associated linking plate 73 and an upwardly facing bipolar magnet 75d supported by the back yoke 75c. Each Y stationary beam 75b is made of magnetic material and is disposed so as to oppose the upwardly facing bipolar magnet 75d of its associated Y magnet unit 75e.

A magnetic attraction force attracting the linking plates 73 as well as the Y stage 70 upwards is produced by a magnetic circuit formed by each Y stationary beam 75b, each back yoke 75c, and each bipolar magnet 75d.

Accordingly, proper selection is made of the dimensions of the bipolar magnets 75d of the Y magnet units 75c and the dimensions of the gaps between the bipolar magnets 75d and the Y stationary beams 75b such that the magnetic attraction force cancels the weight of the Y stage 70 to prevent shifting of the position of the center of gravity of the wafer stage.

The X stage weight compensating structure 85 comprises an X magnet unit 85e including back yokes 85c affixed to both sides of the X stage 80 and upwardly facing bipolar magnets 85d supported by the yokes 85c. The upwardly facing bipolar magnets 85d of each of the X magnet units 85e face their corresponding X stationary frames 85b or second magnetic members made of magnetic material.

Each X stationary frame 85b comprises an engaging portion 85f and a slider member 85g. Each engaging portion 85f engages its associated linking plate 73 such that a portion of each linking plate 73 engages in its associated engaging portion 85f. Each slider member 85g is formed integrally with the lower surface of its associated engaging portion 85f. Each slider member 85g slides along its associated guide bar 85h disposed parallel to the stator 92 of its associated Y linear motor 90. Both ends of each guide bar 85h are supported from the floor surface by X stage weight compensating device supports 85a provided independently of the body frame supporting the table 60.

In this way, each X stationary frame 85b is supported by its associated X stage weight compensating device supports 85a through its associated slider member 85g and guide bar 85h, and moves along with each movable element 91 of each Y linear motor 90 in the Y-axis direction. The magnetic circuit formed by each X stationary frame 85b, each back yoke 85c, and each upwardly facing bipolar magnet 85d produces a magnetic attraction force which attracts the X stage 80 upwards, as was the case with the Y stage 70. The upward attraction cancels the weight of the X stage 80 to prevent shifting of the position of the center of gravity of the wafer stage.

Although in the present embodiment, a magnetic attraction force was used as the attraction force, in other embodiments vacuum attraction forces or electrostatic attraction forces may also be used. In addition, repulsive forces may be used instead of attraction forces to compensate for the movement of the center of gravity.

According to the present embodiment, canceling the weights of the X and the Y stages reduces, for example, tilting of the body frame caused by a shift in the center of gravity of the wafer stage and also reduces the energy consumption as a result of a reduction in the amount of driving force that the X linear motor 100 and the Y linear motor 90 are required to generate. In addition, since the driving forces of the X stage 80 and the Y stage 70 are themselves small, it is possible to, for example, greatly reduce vibration of the table caused by the reaction forces produced when the X and the Y stages are driven.

This increases transfer accuracy in the exposure apparatus, quickens the positioning of a wafer or the like, and greatly improves productivity.

<Embodiment 3>

Figure 7:
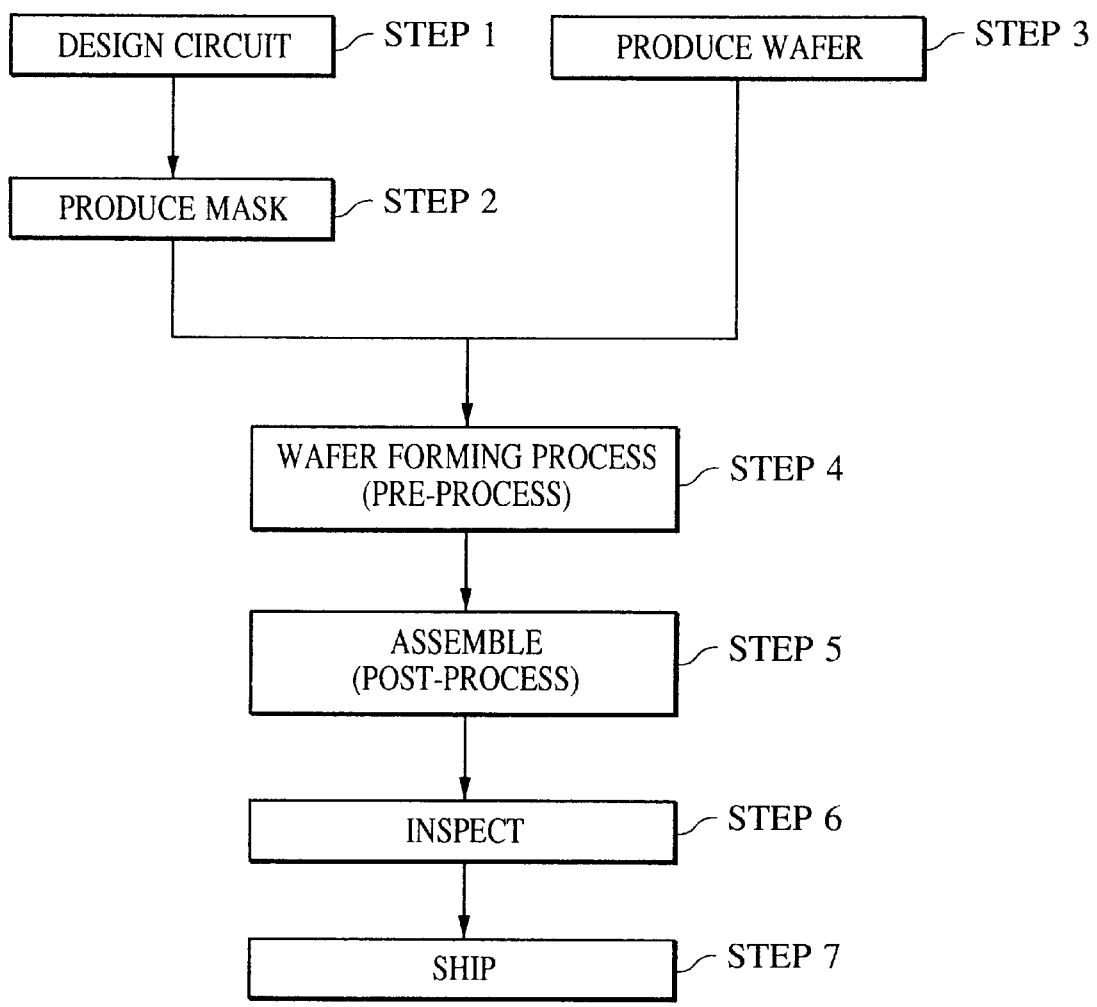
FIG. 7 is a flowchart showing semiconductor production steps.

A description will now be given of an embodiment of a semiconductor device production method using the exposure apparatus described above. FIG. 7 is a flowchart showing the steps for producing a semiconductor device (such as a semiconductor chip including an IC (integrated circuit) and an LSI (large scale integrated circuit)), or a liquid crystal panel, or a CCD (charge coupled device). In Step 1, the circuit of the semiconductor device is designed. In Step 2, a mask with a designed circuit pattern is formed. In Step 3, a wafer is produced using silicon or other such material. In Step 4 (or the wafer forming process), called the pre-processing step, the prepared mask and wafer are used to actually form the circuit onto the wafer using lithography techniques. In Step 5, called the post-processing step, the wafer subjected to circuit formation in Step 4 is used to form a semiconductor chip. This step includes an assembly step (dicing, bonding), a packaging step (of a chip), and the like. In Step 6, the semiconductor device prepared in Step 5 is inspected by conducting such tests as semiconductor device operation confirmation tests and durability tests. Thereafter, in Step 7, the semiconductor device is shipped.

Figure 8:
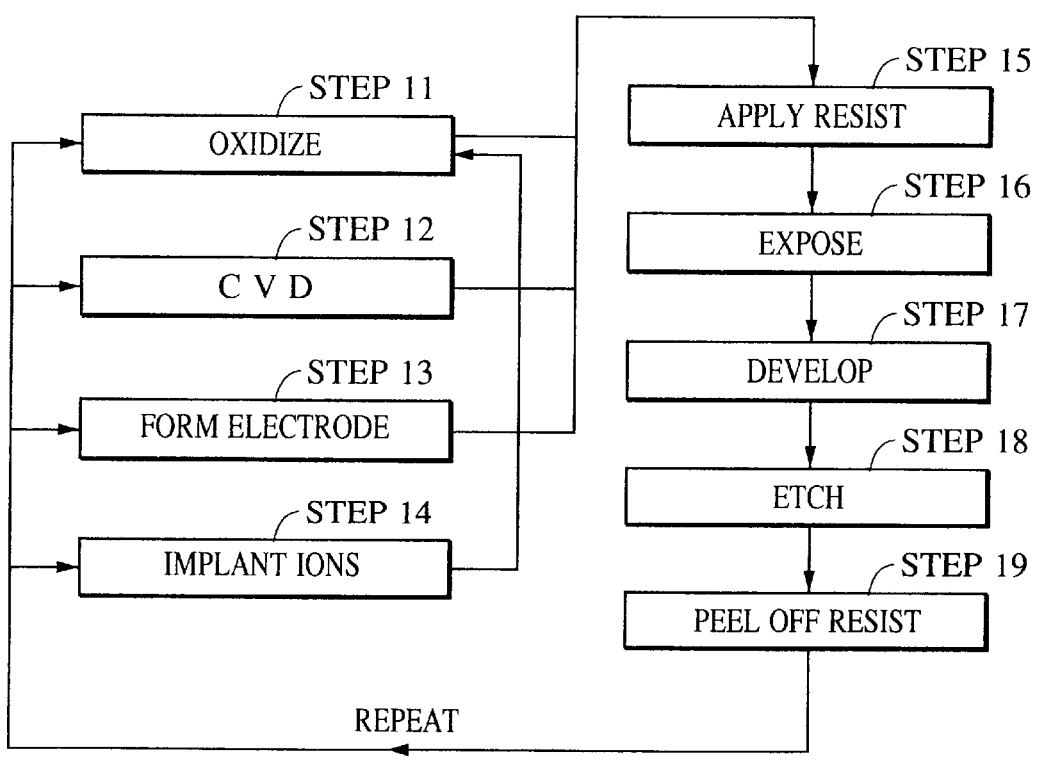
FIG. 8 is a flowchart showing the wafer forming process.
Figure 9:
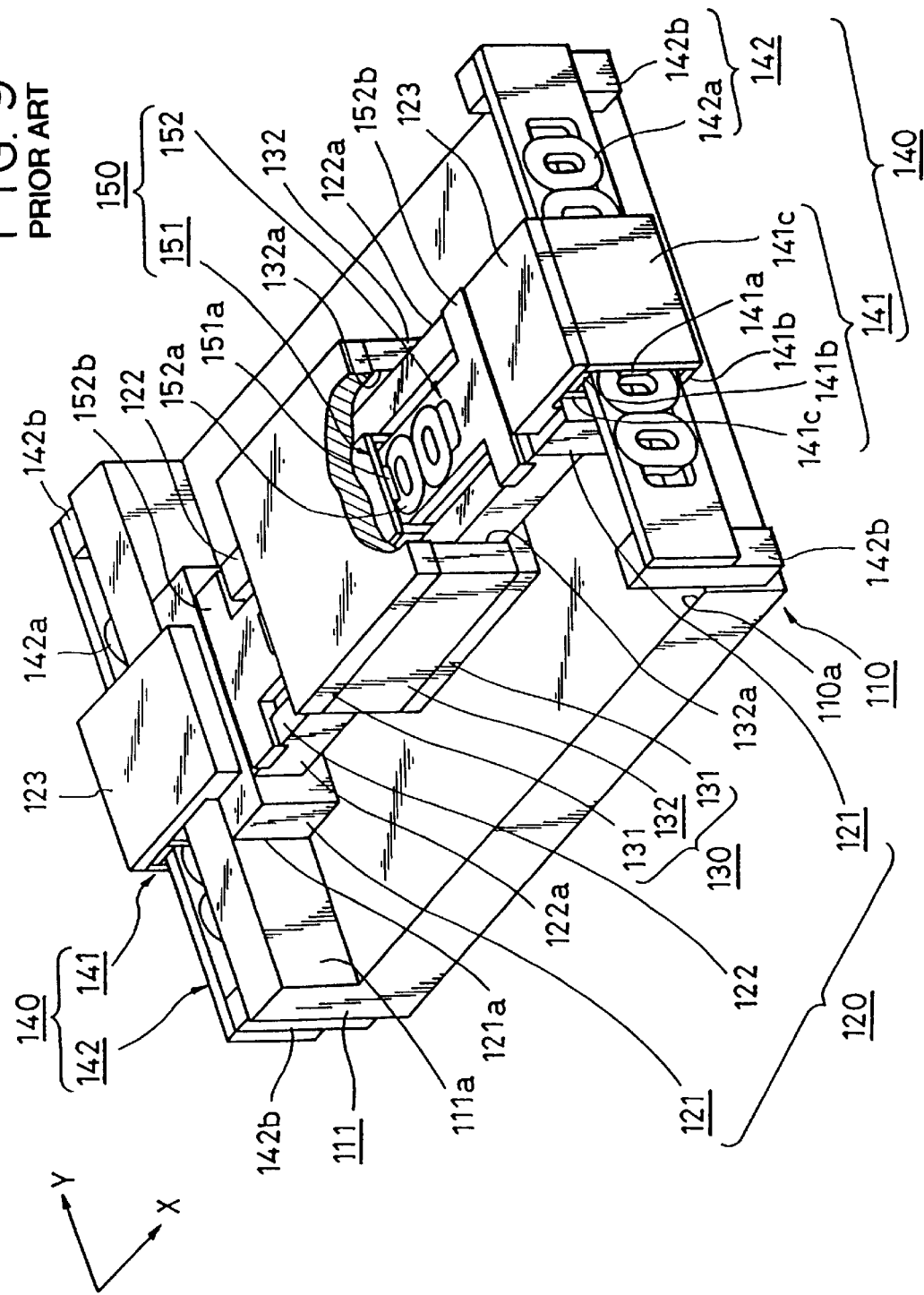
FIG. 9 is a perspective view of a conventional wafer stage.

FIG. 8 is a detailed flowchart showing the above-described wafer forming process. In Step 11, the wafer surface is oxidized. Then, in Step 12 (chemical-vapor deposition (CVD) step), an insulation film is formed on the wafer surface. In Step 13, an electrode is formed on the wafer by evaporation. In Step 14, ions are implanted into the wafer. In Step 15, a photosensitization agent is applied onto the wafer. In Step 16, the mask circuit pattern is printed onto the wafer using the above-described exposure apparatus. In Step 17, the exposed wafer is developed. In Step 18, the portions other than the developed resist image are etched. In Step 19, the undesired resist is removed after etching. Multiple circuit patterns are formed on the wafer by repeating the aforementioned steps. According to the production method in the present embodiment, it is possible to produce a highly-integrated semiconductor device which has been conventionally difficult to produce.

While the present invention has been described with respect to what is presently considered to be the preferred embodiments, it is to be understood that the invention is not limited to the disclosed embodiments. The present invention is intended to cover various modifications and the equivalent arrangements included within the spirit and scope of the appended claims.

What is claimed is:

1. A stage device, comprising:
    a table;
    a first stage movable in a first direction on said table;
    a first linear motor for driving said first stage, said first linear motor including a movable portion and a stationary portion;
    a second stage movable in a second direction with respect to said first stage;
    a second linear motor for driving said second stage, said second linear motor including a movable portion and a stationary portion; and
    a third linear motor for driving said first stage, said third linear motor being disposed between said movable portion of said first linear motor and said first stage.

2. A stage device according to claim 1, further comprising supporting means, provided independently of said table, for supporting the stationary portion of said first linear motor.

3. A stage device according to claim 1, wherein said stationary portion of said second linear motor is directly supported by said movable portion of said first linear motor.

4. A stage device according to claim 1, further comprising a static pressure bearing for supporting said first stage and said second stage above said table in a direction of the center of gravity of said stage device.

5. A stage device, comprising:
    a table;
    a first stage movable in a first direction on said table;
    a first linear motor for driving said first stage, said first linear motor including a stationary portion and a movable portion;
    a second stage movable in a second direction with respect to said first stage;
    a second linear motor for driving said second stage; and
    means for counter-balancing a weight of said first stage and a weight of said second stare to compensate for shifting of a center of gravity of said first stage or a center of gravity of said second stage.

6. A stage device according to claim 5, further comprising a stationary member provided independently of said table, wherein said counter-balancing means comprises at least one of a first mechanism for causing a force to act in a direction of the center of gravity of said first stage between said stationary member and said first stage and a second mechanism for causing a force to act in a direction of the center of gravity of said second stage between the movable portion of said first linear motor and said second stage.

7. A stage device according to claim 6, wherein said first mechanism or said second mechanism includes magnetic means for generating magnetic attraction force.

8. A stage device according to claim 5, further comprising a static pressure bearing which supports each of said first stage and said second stage above said table in a direction of the center of gravity of said stage device.

9. An exposure apparatus comprising means for exposing a substrate to exposure light, and a stage for positioning the substrate for exposure, wherein said stage comprises:
    a table;
    a first stage movable in a first direction on said table;
    a first linear motor for driving said first stage, said first linear motor including a movable portion and a stationary portion;
    a second stage movable in a second direction with respect to said first stage;
    a second linear motor for driving said second stage, said second linear motor including a movable portion and a stationary portion; and
    driving power transmitting means for providing non-contact concurrent movement of the first stage and the second stage.

10. An exposure apparatus comprising means for exposing a substrate to exposure light, and a stage for positioning the substrate for exposure, wherein said stage comprises:
    a table;
    a first stage movable in a first direction on said table;
    a first linear motor for driving said first stage, said first linear motor including a stationary portion and a movable portion;
    a second stage movable in a second direction with respect to said first stage;
    a second linear motor for driving said second stage; and
    means for counter-balancing a weight of said first stage and a weight of said second stare to compensate for shifting of a center of gravity of said first stage or a center of gravity of said second stage.

11. A method of producing a device using an exposure apparatus in which a substrate is positioned by means of a stage for exposure of the substrate, wherein said exposure apparatus comprises means for exposing the substrate to exposure light and a stage device for positioning the substrate for exposure, the stage device comprising: a table; a first stage movable in a first direction on the table; a first linear motor, for driving said first stage, including a movable portion and a stationary portion; a second stage movable in a second direction with respect to the first stage; a second linear motor, for driving said second stage, including a movable portion and a stationary portion; and driving power transmitting means for providing non-contact concurrent movement of the first stage and the second stage, wherein said method comprises the steps of:

(i) positioning the substrate prior to exposure with exposure light, comprising the steps of:
placing the substrate on the stage;
activating the first linear motor to drive the first stage in the first direction by movement of the movable portion thereof;
activating the second linear motor to drive the second stage in the second direction by movement of the movable portion of the second linear motor; and
providing non-contact concurrent movement of the first stage and the second stage using the driving power transmitting means when the first linear motor is activated; and (ii) exposing the substrate to the exposure light.

12. A method of producing a device in which a substrate is positioned by means of a stage for exposure of the substrate, wherein said stage comprises: a table; a first stage movable in a first direction above said table; a first linear motor, for driving said first stage, including a stationary portion and a movable portion; a second stage movable in a second direction with respect to the first stage; a second linear motor for driving the second stage; and means for counter-balancing a weight of the first stage and a weight of the second stage to compensate for shifting of a center of gravity of the first stage or a center of gravity of the second stage, wherein said method comprises the steps of:

(i) positioning the substrate prior to exposure with exposure light, comprising the steps of:
placing the substrate on the stage;
activating the first linear motor to drive the first stage in the first direction by movement of the movable portion thereof;
activating the second linear motor to drive the second stage in the second direction; and
counter-balancing the weight of the first stage and the weight of the second stage to compensate for any shifting that occurs in a position of a center of gravity of the first stage or in a position of a center of gravity of the second stage; and (ii) exposing the substrate to the exposure light.

13. A stage device, comprising:
a table;
a first stage movable in a first direction on said table;
a first linear motor for driving said first stage, said first linear motor including a stationary portion and a movable portion;
a second stage movable in a second direction with respect to said first stage;
a second linear motor for driving said second stage;
a stationary member provided independently of said table; and
compensating means for compensating for shifting of a center of gravity of said first stage or a center of gravity of said second stage caused by movement of said first stage or said second stage, wherein said compensating means comprises at least one of a first mechanism for causing a force to act in a direction of the center of gravity of said first stage between said stationary member and said first stage and a second mechanism for causing a force to act in a direction of the center of gravity of said second stage between the movable portion of said first linear motor and said second stage.

14. A stage device according to claim 13, wherein said first mechanism comprises magnetic means for generating a magnetic attraction force.

15. A stage device according to claim 13, wherein said second mechanism comprises magnetic means for generating a magnetic attraction force.

16. A stage device comprising:
a table;
a first stage movable in a first direction on said table;
a first linear motor including a movable portion and a stationary portion;
a second stage movable in a second direction with respect to said first stage;
a second linear motor including a movable portion and a stationary portion, said movable portion of said second linear motor being fixed to said second stage and said stationary portion of said second linear motor being fixed to said movable portion of said first linear motor; and
a third linear motor for driving said first stage in the first direction.

17. A stage device according to claim 16, wherein said third linear motor comprises a movable portion and a stationary portion, said movable portion being fixed to said first stage and said stationary portion being fixed to said movable portion of first linear motor.

18. A stage device according to claim 16, further comprising a static pressure bearing for supporting said first stage and said second stage above said table.

19. An exposure apparatus comprising:
means for exposing a substrate to exposure light; and
a stage for positioning the substrate for exposure, said stage comprising:
(i) a table;
(ii) a first stage movable in a first direction on said table;
(iii) a first linear motor including a movable portion and a stationary portion;
(iv) a second stage movable in a second direction with respect to said first stage;
(v) a second linear motor including a movable portion and a stationary portion, said movable portion of said second linear motor being fixed to said second stage and said stationary portion of said second linear motor being fixed to said movable portion of said first linear motor; and
(vi) a third linear motor for driving said first stage.

20. A method of producing a device using an exposure apparatus in which a substrate is positioned by means of a stage for exposure of the substrate, wherein the exposure apparatus comprises means for exposing the substrate to exposure light and a stage device for positioning the substrate for exposure, the stage device comprising a table, a first stage movable in a first direction on the table, a first linear motor including a movable portion and a stationary portion, a second stage movable in a second direction with respect to the first stage, a second linear motor including a movable portion and a stationary portion, the movable portion of the second linear motor fixed to the second stage and the stationary portion of the second linear motor fixed to the movable portion of the first linear motor, and a third linear motor for driving the first stage, said method comprising the steps of:

(i) positioning the substrate prior to exposure with exposure light, comprising the steps of:

placing the substrate on the stage device;

activating the first linear motor to drive the stationary portion of the second linear motor in the first direction by movement of the movable portion of the first linear motor;

activating the second linear motor to drive the second stage in the second direction by movement of the movable portion of the second linear motor;

activating the third linear motor to drive the first stage in the first direction by movement of a movable portion of the third linear motor when the stationary portion of the second linear motor is activated in the first direction; and (ii) exposing the substrate to the exposure light.

* * * * *

UNITED STATES PATENT AND TRADEMARK OFFICE
CERTIFICATE OF CORRECTION

PATENT NO. : 6,002,465

DATED : December 14, 1999

INVENTORS : NOBUSHIGE KORENAGA

It is certified that error appears in the above-identified patent and that said Letters Patent is hereby corrected as shown below:

ON THE TITLE PAGE:
Item [56], Under "References Cited", "U.S. PATENT DOCUMENTS", "5,684,856  11/1997  Ito et al." should read
--5,684,856  11/1997  Itoh et al.--.

IN THE DISCLOSURE:
COLUMN 14:
Line 8, "stare" should read --stage--; and
Line 58, "stare" should read --stage--.

Signed and Sealed this

Sixth Day of February, 2001

Attest:

Q. TODD DICKINSON

*Attesting Officer*    *Director of Patents and Trademarks*